United States Patent [19]

Suzuki et al.

[11] Patent Number: 4,914,260
[45] Date of Patent: Apr. 3, 1990

[54] CERAMIC MULTI-LAYER PRINTED CIRCUIT BOARDS

[75] Inventors: Go Suzuki; Toshiki Goto, both of Nagoya, Japan

[73] Assignee: NGK Insulators, Ltd., Japan

[21] Appl. No.: 330,761

[22] Filed: Mar. 30, 1989

[30] Foreign Application Priority Data

Mar. 30, 1988 [JP] Japan .................................. 63-74713

[51] Int. Cl.⁴ ............................................. H05K 1/00
[52] U.S. Cl. ..................................... 174/255; 174/256
[58] Field of Search ...................... 174/68.5, 255, 256

[56] References Cited

U.S. PATENT DOCUMENTS

| | | | |
|---|---|---|---|
| 4,325,780 | 4/1982 | Schulz, Sr. ...................... | 174/68.5 X |
| 4,529,835 | 7/1985 | Mizuno .............................. | 174/68.5 |
| 4,598,167 | 7/1986 | Ushifusa et al. ..................... | 174/68.5 |
| 4,713,494 | 12/1987 | Oikawa et al. ..................... | 174/68.5 |
| 4,795,670 | 1/1989 | Nishigaki et al. .............. | 174/68.5 X |
| 4,821,142 | 4/1989 | Ushifusa et al. ............... | 174/68.5 X |
| 4,828,961 | 5/1989 | Lau et al. ......................... | 430/311 X |

*Primary Examiner*—Morris H. Nimmo
*Attorney, Agent, or Firm*—Arnold, White & Durkee

[57] ABSTRACT

A ceramic multi-layer printed circuit board is manufactured by forming a wiring pattern layer on a ceramic substrate through copper plating and forming an insulating layer thereon and then repeating the steps for forming both layers.

3 Claims, 3 Drawing Sheets

FIG_1a
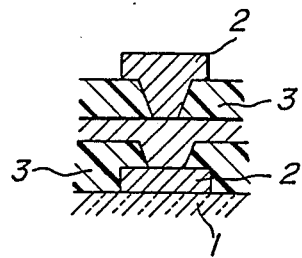
FIG_1b
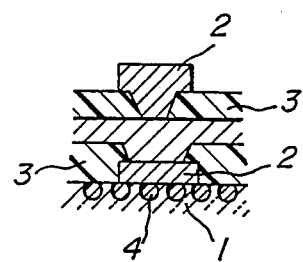
FIG_1c
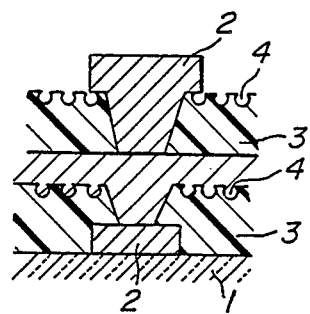
FIG_1d
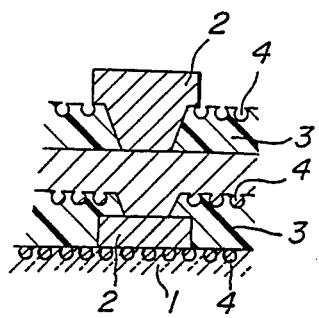

FIG_2a
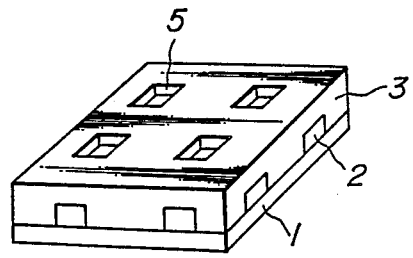
FIG_2b
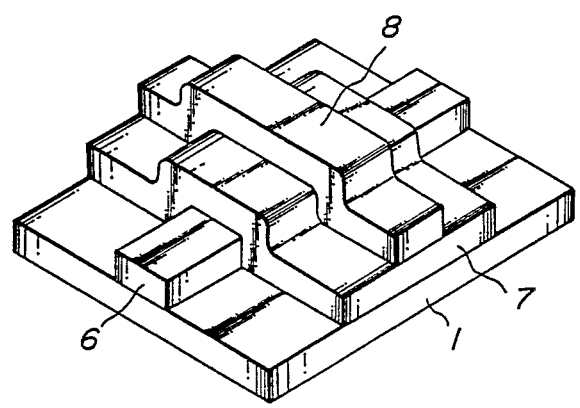

FIG_3
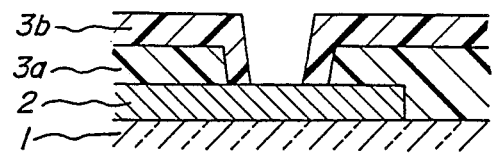
FIG_4
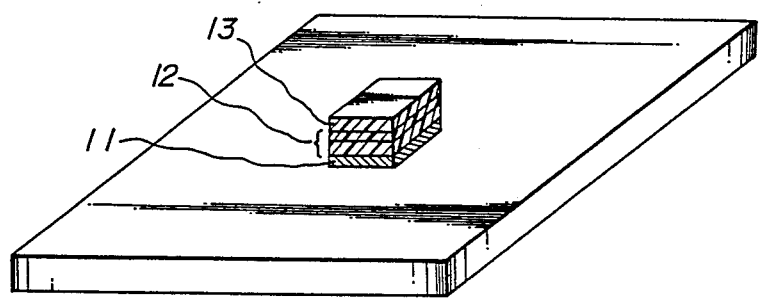

CERAMIC MULTI-LAYER PRINTED CIRCUIT BOARDS

BACKGROUND OF THE INVENTION

1. Field of the Invention

This invention relates to a ceramic multi-layer printed circuit board comprised of a combination of copper plated wiring pattern layers and insulating layers.

2. Related Art Statement

As a method of producing a ceramic multi-layer printed circuit board by alternately laminating plural wiring pattern layers and insulating layers, there have hitherto been known thick film method, thin film method, plating method and the like.

In the thick film method, the multilayer formation is carried out by forming a wiring pattern layer with Ag-Pd paste or Cu paste through a printing process and further forming an insulating layer thereon. However, the width of the wiring line formed by the printing process is critical and is 100 μm at most. There is a problem that it is difficult to form fine wiring line below the above value.

In the thin film method, the wiring pattern layer is formed by sputtering process, vapor deposition process or the like and further the insulating layer is formed thereon. However, there is a problem that the equipment cost and production cost become higher.

In the plating method, the multilayer formation is carried out by forming a conductor layer through plating and further forming the insulating layer of an organic substance such as polyimide or the like thereon. Since the heat resisting temperature of polyimide is not higher than 400° C., there is caused an inconvenient problem when the resulting printed circuit board is treated at a high temperature above 400° C. at the subsequent step.

SUMMARY OF THE INVENTION

It is, therefore, an object of the invention to solve the aforementioned problems and to provide ceramic multi-layer printed circuit boards having good heat resistance, bonding property between layers and capable of forming fine wiring line in the multilayer formation.

According to the invention, there is the provision of a ceramic multi-layer printed circuit board, characterized in that a wiring pattern layer is formed on a ceramic substrate by a copper plating and a ceramic insulating layer is formed thereon by a printing process with a ceramic paste, preferably by a photo-lithography process with a ultraviolet ray curing type paste containing ceramic powder and formations of such a wiring pattern layer and insulating layer are repeated plural times.

BRIEF DESCRIPTION OF THE DRAWINGS

The invention will be described with reference to the accompanying drawings, wherein:

FIGS. 1a to 1d are diagrammatically outline views illustrating various embodiments of the multi-layer printed circuit board according to the invention, respectively;

FIGS. 2a and 2b are perspective views showing a state of the formed insulating layer, respectively;

FIG. 3 is an outline view of another embodiment showing a state of the formed insulating layer; and FIG. 4 is a perspective view of a sample used for confirming the effect of the invention.

DESCRIPTION OF THE PREFERRED EMBODIMENTS

According to the above construction of the invention, the multilayer formation of fine wiring pattern is made possible at a low cost by forming the wiring pattern layer on the ceramic substrate through the copper plating, and further it is made possible to conduct a subsequent heating step with a glass seal or the like.

The multi-layer printed circuit board comprised of a combination of the copper plated wiring pattern layers and the insulating layers, preferably insulating layers using a thermosetting type ceramic paste is a structure which has never been thought in the conventional technique. In the formation of such a structure, it is preferable that holes each having an anchor effect are formed in the ceramic substrate and also holes each having an anchor effect are formed in the insulating layer, whereby the good bonding property between the layers is obtained.

The production of the ceramic multi-layer printed circuit board according to the invention will be described with reference to the following typical example.

In general, the substrate is an alumina substrate containing 80~99.5% of alumina, but the other ceramic substrate may be used. If necessary, holes having an anchor effect are formed in the substrate. Then, a copper plated film is formed on the substrate in place through an electroless copper plating. Further, the copper plated film is thickened to a given thickness through an electric copper plating to form a wiring pattern layer. In this case, a resist pattern is formed on the copper plated film by a printing process, or a photolithography process using a wet resist or dry resist, and thereafter the copper plated film is etched to form the copper plated wiring pattern layer. Next, an insulating paste is applied to the copper plated wiring pattern layer through a printing process and fired in an atmosphere not oxidizing the copper plated wiring pattern layer. Moreover, steps from the plating to the firing of the insulating paste are repeated till the desired wiring pattern layer number is obtained.

An embodiment of the ceramic multi-layer printed circuit board obtained by the above method according to the invention is shown in FIGS. 1a to 1d as a two-layer structure. In the embodiment of FIG. 1a, a copper plated wiring pattern layer 2 is formed on a substrate 1, and further an insulating layer 3 is formed on that portion of the layer 2 which does not require an electrical connection to another upper wiring pattern layer. The embodiment of FIG. 1b is a modified example of FIG. 1a, wherein holes 4 having an anchor effect are formed in the substrate 1. The embodiment of FIG. 1c is another modified example of FIG. 1a, wherein holes 4 having an anchor effect are formed in the insulating layer 3. In the embodiment of FIG. 1d, holes 4 having an anchor effect are formed in both the substrate 1 and the insulating layer 3.

The invention will be described with respect to various conditions on the substrate, copper plated wiring pattern layer and insulating layer below.

① Substrate

After the copper plated wiring pattern layer is formed on the substrate and then the insulating layer is formed thereon, the wiring pattern layer is heated in the firing of the insulating layer. In this case, therefore, blister may be produced in the copper plated film due to the difference of thermal expansion between the substrate and the copper plated film. The following Table 1 shows a state of producing the blister when 99.5% alumina substrate, 96% alumina substrate or 90% alumina substrate is subjected to an electroless copper plating at a thickness of 0.5 μm and further to an electric copper plating at a thickness of 20 μm to form a copper plated film, and a copper wiring pattern of 5 mm×40 mm is formed by etching and then fired in $N_2$ gas at 900° C. for 10 minutes.

TABLE 1

| | |
|---|---|
| 90% alumina substrate | no blister |
| 96% alumina substrate | blister occurred |
| 99.5% alumina substrate | blister occurred |

As a method of preventing the occurrence of blister, it is effective to use a substrate previously provided with a porous surface layer having an anchor effect. The porous surface layer is formed by applying a paste of powder selected from alumina, zirconia, mullite and the like to 96% alumina green sheet and simultaneously firing them. Alternatively, the porous surface may be formed by etching the substrate.

② Copper plated wiring pattern layer

In the electroless copper plating, if the plating thickness is thick, the blister is apt to be caused, so that it is necessary to control the plating thickness to about 0.1~1.0 μm. When the plating thickness of more than the above value is desired, it is necessary to form holes having the anchor effect on the substrate to be plated.

If necessary, the plated film is thickened to a given thickness by the electric copper plating followed by the electroless copper plating, and then subjected to an etching with an etching resist to form a wiring pattern layer. Alternatively, the pattern of the etching resist is formed after the electroless copper plating, and then the electric copper plating is selectively conducted, whereby the copper plated wiring pattern layer may be formed.

③ Insulating layer

As the insulating paste, there may be used one capable of firing in a firing atmosphere not oxidizing copper, usually a nitrogen gas atmosphere. In general, the insulating paste to be used by combining with the copper plated thick film is used. For example, DuPont 4574 D (trade name) is commercially available. As the ultraviolet ray curing type insulating paste containing ceramic powder, a mixture obtained by mixing each of various silicate glasses containing at least one of $Al_2O_3$, $B_2O_3$, MgO, PbO, BaO, ZnO, $LiO_2$, $TiO_2$, CaO, $ZrO_2$ and other ingredient with a copolymer having a susceptivity to ultraviolet ray can preferably be used.

As the form of the insulating layer, an insulating layer 3 having via holes 5 is formed over a whole of the substrate 1 as shown in FIG. 2a, or a copper plated conductor 6 of the underlayer and an insulating layer 7 are partly formed on the substrate 1 and then a copper plated conductor 8 of the upperlayer is formed thereon so as to insulate the copper plated conductor 8 from the copper plated conductor 6 as shown in FIG. 2b.

In accordance with the size of the via hole formed in the insulating layer, the kind of the insulating paste used differs. When the size of the via hole is not less than 200 μm, the insulating via hole is formed by a printing process. When it is less than 200 μm, the insulating paste is selected from the ultraviolet ray curing type pastes. In the latter case, the via hole is formed by a photolithography process, wherein the insulating paste is applied to the whole surface by a printing process and cured by irradiation of ultraviolet ray to portions other than via hole forming portions with a photomask and then the via hole portions are removed by development to form the via holes. Moreover, when the insulating layer per one layer is a two-layer structure as shown in FIG. 3, rough via holes are formed in a first layer 3a by a printing process, and then via holes of a given size can be formed in a second layer 3b by using the ultraviolet ray curing type insulating paste.

When a second layer of copper plated wiring pattern layer is further formed on the insulating layer by electroless copper plating and electric copper plating, if the bonding property between the insulating layer and the second wiring pattern layer is lacking, blister is apt to be caused between the insulating layer and the wiring pattern layer in the formation of second insulating layer. In this case, therefore, it is preferable that holes having the anchor effect are previously formed in the first insulating layer.

As a method of forming these holes, the insulating layer having a sufficient insulation property is first formed at a usual firing temperature for the formation of the insulating layer, and further the insulating layer is formed thereon at a temperature lower than the usual firing temperature. The latter temperature is desirable to be such a temperature that the organic substance contained in the insulating paste is burnt out to insufficiently sinter the glass component as an inorganic substance in the insulating paste to thereby form the holes in the insulating layer, and is selected from the range of 50°~200° C. lower than the usual firing temperature.

As another method of forming the holes in the insulating layer, after the insulating layer having a sufficient insulation property is formed in the usual manner, a second insulating layer is formed by using an insulating paste easily forming the hole. As the formation of the second insulating layer, there may be used a method of using an organic resin having a poor burning out property, a method of using a large amount of an organic resin, a method of using a ceramic composition having a poor sinterability, and the like.

The following example is given in illustration of the invention and is not intended as limitation thereof.

The state of blister occurrence and the bonding strength were measured with respect to combinations of various substrates and insulating layers. As the substrate, there were used 96% alumina substrate, a substrate obtained by applying a paste-like slurry of alumina beads to 96% alumina green sheet at a thickness of 30 μm and at the same time firing it to form a porous surface layer, and 90% alumina substrate.

On each of these substrates was formed a first copper plated wiring pattern layer 11 comprised of an electroless plated copper film with a thickness of 0.7 μm and an electric plated copper film with a thickness of 15 μm, which was then etched to form a pad of 2 mm×2 mm as shown in FIG. 4. Then, an insulating layer 12 was formed on the layer 11 within a thickness range of 50~70 μm by various methods, and a second copper plated wiring pattern layer 13 was formed thereon, if necessary. Thereafter, a tin plated copper wire of 0.8 mm in diameter was soldered onto the pad in a direction perpendicular to the pad to measure the bonding strength. The measured results are shown in the following Table 2.

TABLE 2

| Run No. | | Substrate | Insulating layer | Occurrence of blister | Bonding strength (kg/mm$^2$) |
|---|---|---|---|---|---|
| Acceptable example | 1 | 90% alumina substrate | First layer: DuPont 4575D, 900° C. firing<br>Second layer: DuPont 4575D, 800° C. firing | none | 1.8 |
| | 2 | 90% alumina substrate | First layer: DuPont 4575D, 900° C. firing<br>Second layer: ultraviolet ray curing type insulating paste, 700° C. firing | none | 1.8 |
| | 3 | 90% alumina substrate | ultraviolet ray curing type insulating paste, 850° C. firing | none | 1.5 |
| | 4 | 90% alumina substrate | ultraviolet ray curing type insulating paste, 850° C. firing, having a porous surface layer | none | 1.8 |
| | 5 | 96% alumina substrate provided with porous surface layer | First layer: DuPont 4575D, 900° C. firing<br>Second layer: DuPont 4575D, 800° C. firing | none | 2.0 |
| | 6 | 96% alumina substrate provided with porous surface layer | ultraviolet ray curing type insulating paste, 850° C. firing | none | 1.5 |
| | 7 | 96% alumina substrate provided with porous surface layer | ultraviolet ray curing type insulating paste, 850° C. firing, having a porous surface layer | none | 2.5 |
| | 8 | 96% alumina substrate provided with porous surface layer | First layer: DuPont 4575D, 900° C. firing<br>Second layer: paste containing increased amount of organic resin | none | 2.0 |
| Comparative example | 1 | 96% alumina substrate | DuPont 4575D, 900° C. firing | generated on alumina substrate | measurement impossible |
| | 2 | 96% alumina substrate provided with porous surface layer | DuPont 4575D, 900° C. firing | generated on insulating layer | measurement impossible |

As seen from Table 2, when using the 96% alumina substrate, the porous surface layer is formed on the substrate and further the second insulating layer is fired at a temperature lower than the usual firing temperature, whereby the multilayer formation of the copper plated wiring pattern layers and the insulating layers can be conducted at a sufficient bonding force without generating blister. Further, when using the 90% alumina substrate, the sufficient bonding force can be obtained without generating blister by properly selecting the firing conditions of the insulating layer and the material used for the formation of the insulating layer without the formation of the porous surface layer.

As mentioned above, according to the ceramic multi-layer printed circuit board of the invention, the copper plated wiring pattern layer and the insulating layer are alternately formed on the ceramic substrate at a multi-layered state, and preferably holes having an anchor effect are formed in the substrate and/or the insulating layer in the multilayer formation, whereby the multi-layer formation of fine wiring pattern can be performed at a sufficient bonding force between the layers.

What is claimed is:

1. A ceramic multi-layer printed circuit board characterized in that a wiring pattern layer is formed on a ceramic substrate by a copper plating and a ceramic insulating layer is formed thereon by a printing process with a ceramic paste and formations of such a wiring pattern layer and insulating layer are repeated plural times.

2. The ceramic multi-layer printed circuit board according to claim 1, wherein said insulating layer is formed by using a ultraviolet ray curing type insulating paste containing ceramic powder.

3. The ceramic multi-layer printed circuit board according to claim 1, wherein holes having an anchor effect are formed in said substrate and/or said insulating layer.

* * * * *